United States Patent
Kido et al.

(10) Patent No.: US 6,396,209 B1
(45) Date of Patent: May 28, 2002

(54) ORGANIC ELECTROLUMINESCENT DEVICE

(75) Inventors: Junji Kido, 9-3-4 Umamikita, Kouryou-cho, Kitakatsuragi-gun, Nara-ken; Tokio Mizukami, Kanagawa-ken; Jun Endoh, Kanagawa-ken; Kohichi Mori, Kanagawa-ken, all of (JP)

(73) Assignees: International Manufacturing and Engineering Services Co., Ltd., Kanagawa-Ken; Junji Kido, Nara-Ken, both of (JP)

( * ) Notice: Subject to any disclaimer, the term of this patent is extended or adjusted under 35 U.S.C. 154(b) by 0 days.

(21) Appl. No.: 09/459,830

(22) Filed: Dec. 13, 1999

(30) Foreign Application Priority Data

Dec. 16, 1998 (JP) .............................. 10-357899

(51) Int. Cl.$^7$ ...................... H05B 33/00; H05B 33/02
(52) U.S. Cl. .................. 313/504; 313/506; 313/503; 428/917
(58) Field of Search .................. 313/506, 504, 313/505, 503; 315/169.3; 428/690, 917

(56) References Cited

U.S. PATENT DOCUMENTS

| | | | | |
|---|---|---|---|---|
| 5,844,363 A | * | 12/1998 | Gu et al. | .................... 313/506 |
| 5,955,834 A | * | 9/1999 | Epstein et al. | .......... 313/506 X |
| 5,965,281 A | * | 10/1999 | Cao | ........................... 313/506 |

FOREIGN PATENT DOCUMENTS

| | | | | |
|---|---|---|---|---|
| EP | 373582 | 3/1995 | ........... | H05B/33/14 |
| EP | 388768 | 8/1995 | ........... | H05B/33/14 |
| EP | 0 936 844 A2 | 8/1999 | ........... | H05B/33/26 |
| JP | 59-194393 | 11/1984 | ........... | H05B/33/14 |
| JP | 63-295695 | 12/1988 | ........... | C09K/11/06 |
| JP | 2-88689 | 3/1990 | ........... | C09K/11/06 |
| JP | 2-191694 | 7/1990 | ........... | C09K/11/00 |
| JP | 2-196885 | 8/1990 | ........... | C09K/11/06 |
| JP | 2-250292 | 10/1990 | ........... | H05B/33/14 |
| JP | 2-252793 | 10/1990 | ........... | C09K/11/06 |
| JP | 2-255789 | 10/1990 | ........... | C09K/11/06 |
| JP | 2-289676 | 11/1990 | ........... | C09K/11/06 |

(List continued on next page.)

OTHER PUBLICATIONS

XP–000997350—J. Endo et al.: "Organic Electroluminescent devices using metal complexes as an electron injection layer" Ext. Abstr. 16A–YH–10 (59th Autumn Meeting 1998) Japan Society of Applied Physics, (Sep. 17, 1998), p. 1086.

Polymer Light–Emitting Electrochemical Cells, vol. 269 pp. 1086–1089; Aug. 1995.

Physical Review Letters (vol. 14, No. 7), pp. 228–231, Feb. 1965.

(List continued on next page.)

*Primary Examiner*—Ashok Patel
(74) *Attorney, Agent, or Firm*—McCormick, Paulding & Huber LLP

(57) ABSTRACT

An organic electroluminescent (EL) device including at least one luminescent layer, constituted from an organic compound, between a cathode electrode and an anode electrode, the EL device further comprising an organic layer adjacent to the cathode electrode, in which the organic layer is constituted from a mixed layer of an electron-transporting organic compound and an organic metal complex compound containing at least one of alkali metal ions, alkali earth metal ions and rare earth metal ions, and the cathode electrode is constituted from a metal capable of reducing the metal ion(s) in the complex compound, in a vacuum, to the corresponding metal.

5 Claims, 3 Drawing Sheets

FOREIGN PATENT DOCUMENTS

| | | | |
|---|---|---|---|
| JP | 3-231970 | 10/1991 | ........... C09B/23/00 |
| JP | 3-296595 | 12/1991 | ........... C09K/11/06 |
| JP | 4-96990 | 3/1992 | ........... C09K/11/06 |
| JP | 5-9470 | 1/1993 | ........... C09K/11/06 |
| JP | 5-17764 | 1/1993 | ........... C09K/11/06 |
| JP | 5-202011 | 8/1993 | ......... C07D/271/10 |
| JP | 6-25659 | 2/1994 | ........... C09K/11/06 |
| JP | 6-49079 | 2/1994 | ............. C07F/7/10 |
| JP | 6-88072 | 3/1994 | ........... C09K/11/06 |
| JP | 6-92947 | 4/1994 | ......... C07D/271/10 |
| JP | 6-100857 | 4/1994 | ........... C09K/11/06 |
| JP | 6-107648 | 5/1994 | ......... C07D/271/10 |
| JP | 6-132080 | 5/1994 | ........... H05B/33/14 |
| JP | 6-145146 | 5/1994 | ......... C07D/215/30 |
| JP | 6-203963 | 7/1994 | ........... H05B/33/22 |
| JP | 6-206865 | 7/1994 | ......... C07D/209/86 |
| JP | 6-207170 | 7/1994 | ........... C09K/11/06 |
| JP | 6-215874 | 8/1994 | ........... H05B/33/22 |
| JP | 6-279322 | 10/1994 | ......... C07C/13/547 |
| JP | 6-279323 | 10/1994 | ......... C07C/13/567 |
| JP | 6-293778 | 10/1994 | ............. C07F/7/10 |
| JP | 7-97355 | 4/1995 | ......... C07C/211/54 |
| JP | 7-101911 | 4/1995 | ......... C07C/211/61 |
| JP | 7-126225 | 5/1995 | ......... C07C/211/54 |
| JP | 7-126226 | 5/1995 | ......... C07C/211/54 |
| JP | 7-145116 | 6/1995 | ......... C07C/211/54 |
| JP | 7-157473 | 6/1995 | ......... C07D/251/24 |
| JP | 7-179394 | 7/1995 | ........... C07C/63/72 |
| JP | 7-188130 | 7/1995 | ......... C07C/211/54 |
| JP | 7-224012 | 8/1995 | ......... C07C/211/61 |
| JP | 7-228579 | 8/1995 | ......... C07D/271/10 |
| JP | 07268317 | 10/1995 | ........... C09K/11/06 |
| JP | 7-278124 | 10/1995 | ......... C07D/271/10 |
| JP | 8-22557 | 1/1996 | ........... G06T/15/00 |
| JP | 8-40995 | 2/1996 | ......... C07C/211/54 |
| JP | 8-40996 | 2/1996 | ......... C07C/211/54 |
| JP | 8-40997 | 2/1996 | ......... C07C/211/54 |
| JP | 8-48656 | 2/1996 | ......... C07C/211/54 |
| JP | 8-81472 | 3/1996 | ............. C07F/3/00 |

OTHER PUBLICATIONS

IEEE Transactions on Electron Diodes (vol. 40, No. 7), pp. 1342, 1344; Jul. 1993.

Organic Electroluminescent Diodes, Tang et al; Applied Physics, Letter 51(12); Sep. 1987.

Society for Information Display International Symposium Digest of Technical Papers (vol. XXVIII); Kido et al, Dec. 1997.

Organic EL Cells Using Alkaline Metal Compounds as Electron Injection Materials, Aug. 1997.

Electroluminescence from Polyvinylcarbazole, Patridge, Polymer, vol. 24 Jun. 1983.

Organic EL Devices With a Quinacridon Derivative Showing Higher Brightness and Luminescent Efficiency—Publication date Sep. 27, 1993.

High Bright Organic Thin Film EL Devices Using a Li Alloy Cathode—Publication Date Sep. 26, 1990.

A Calcium Oxide Can be Reduced by Aluminum—Publication Date Oct. 15, 1986.

Metal Handbook p. 88—Publication Date Mar. 31, 1990.

Metal Handbook p. 87—Publication Date Mar. 31, 1990.

\* cited by examiner

ORGANIC ELECTROLUMINESCENT DEVICE

BACKGROUND OF THE INVENTION

1. Field of the Invention

The present invention relates to an organic electroluminescent device or element (hereinafter, referred also to as an "organic EL device") which can be utilized as a planar light source or utilized in display devices, for example.

2. Description of the Related Art

Recently, attention has been drawn to organic EL devices in which a luminescent layer, i.e., light emission layer, is formed from a specific organic compound. The reason for the recent attention is that such organic EL devices can achieve a large area display device which can be operated at a low voltage. To obtain a highly efficient EL device, Tang et al., as is reported in Appl. Phys. Lett., 51, 913 (1987), have succeeded in attaining an EL device having a structure in which organic compound layers having different carrier transporting properties are laminated to thereby introduce holes and electrons with good balance via an anode and a cathode, respectively. In addition, since the thickness of the organic compound layers is less than or equal to 2,000 Å, the EL device can exhibit a high luminance and efficiency sufficient for practical use; i.e., a luminance of about 1,0000 $cd/m^2$ and an external quantum efficiency of about 1% at an applied voltage of no more than about 10 volts.

In this highly efficient EL device, Tang et al. have used magnesium (Mg) having a low work function in combination with an organic compound which is essentially considered to be an electrically insulating material, in order to reduce an energy barrier which can cause a problem during injection of electrons from a metal electrode. However, since the magnesium is unstable and is liable to oxidization, and also exhibits only a poor adhesion to a surface of the organic layers, magnesium was used after alloying. Alloying is carried out by vapor co-deposition or simultaneous evaporation of magnesium and silver (Ag) which is relatively stable and exhibits good adhesion to the surface of the organic layers.

The researchers of Toppan Printing Co. (cf, 51st periodical meeting, Society of Applied Physics, Preprint 28a-PB-4, p.1040) and researchers of Pioneer Co. (cf, 54th periodical meeting, Society of Applied Physics, Preprint 29p-ZC-15, p.1127) have had developments in the usage of lithium (Li), which has an even lower work function than that of Mg, and alloying Li with an aluminum (Al) to obtain a stabilized cathode, thereby embodying a lower driving voltage and a higher emitting luminance in comparison with those of the EL device using Mg alloy. In addition, as is reported in IEEE Trans. Electron Devices., 40, 1342 (1993), the inventors of the present application have found that a two-layered cathode produced by depositing lithium (Li) alone with a very small thickness of about 10 Å on an organic compound layer, followed by laminating a silver (Ag) to the deposited Li layer is effective to attain a low driving voltage in an EL device.

Recently, Pei et al. of Uniax Co. have proceeded to reduce the driving voltage of an EL device by doping a polymeric luminescent layer with a Li salt (cf. Science, 269, 1086 (1995)). This doping method is intended to dissociate the Li salt dispersed in the polymeric luminescent layer to distribute Li ions and counter ions near the cathode and near the anode, respectively, thus ensuring an in-situ doping of the polymer molecules positioned near the electrodes. According to this method, since the polymers near the cathode are reduced with Li as a donor dopant, i.e., electron-donating dopant, and thus the reduced polymers are contained in the state of radical anions, a barrier of the electron injection from the cathode can be considerably reduced, contrary to the similar method including no Li doping.

More recently, the inventors of the present application have found that the driving voltage of an EL device can be reduced by doping an alkali metal such as lithium and the like, an alkali earth metal such as strontium and the like, or a rare earth metal such as samarium and the like, to an organic layer adjacent to the cathode electrode (cf. SID 97, Digest, P.775). It was believed that such reduction of the driving voltage could be obtained because a barrier in the electron injection from the cathode electrode can be notably reduced due to a radical anion state in the organic layer adjacent to the electrode produced by metal doping therein.

However, due to oxidation of the electrodes and other reasons, deterioration of the device can result in the above-described EL devices using an alloy of Mg or Li as the electrode material. In addition, the use of such alloy electrodes has the disadvantage of limited selection of a material suitable for an electrode, because the electrode material to be used has to simultaneously satisfy the requirement for the function as a wiring material. Furthermore, the above described two-layered cathode developed by the present inventors is unable to act as a cathode when the thickness of the Li layer is more than about 20 Å (cf. IEEE Trans. Electron Devices., 40, 1342 (1993), and also has the disadvantage of low reproducibility, because there is difficulty in the control of the layer thickness when the Li layer is deposited at a considerably reduced thickness in the order of about 10 Å. Furthermore, in the in-situ doping method developed by Pei et al. in which the Li salt is added to the luminescent layer to cause their dissociation in the electric field, there is a problem with the transfer time of the dissociated ions to the close vicinity of the electrodes having a controlled velocity, thereby causing a considerable retardation of the response speed of the devices.

Moreover, in the method which includes doping the metal as a dopant in the organic layer, it is necessary to precisely control the concentration of the dopant during formation of the organic layer, because the doping concentration may affect the properties of the resulting devices.

SUMMARY OF THE INVENTION

The present invention has been made to solve the above-described problems of the prior art EL devices, and accordingly, one object of the present invention is to reduce the energy barrier in the electron injection from a cathode electrode to an organic compound layer in accordance with a simple and reliable method to thereby ensure a low driving voltage of the EL devices regardless of the work function of the cathode material.

Another object of the present invention is to provide a device (organic EL device) capable of ensuring satisfactory characteristics which are similar to, or better than, those obtained using the above-described alloy as the electrode material, even if aluminum or other low-cost stable metals which are conventionally used as the wiring material in the prior art are used solely as the cathode material.

In order to achieve the above mentioned objects, an organic electroluminescent device is provided which includes at least one luminescent layer, constituted from an organic compound, between a cathode electrode and an anode electrode opposed to the cathode electrode. The electroluminescent device further includes an organic layer adjacent to the cathode electrode, the organic layer being a mixed layer of an electron-transporting organic compound and an organic metal complex compound containing at least one member selected from the group including an alkali metal ion, an alkali earth metal ion and a rare earth metal ion. The cathode electrode includes a metal capable of reducing the metal ion(s) in the organic metal complex compound of the mixed layer, in a vacuum, to the corresponding metal.

Preferably, the mixed layer is a layer formed upon co-deposition of the organic metal complex compound and the electron-transporting organic compound.

Preferably, the metal used in the formation of the cathode electrode is any one of aluminum, zirconium, titanium, yttrium, scandium and silicon.

Preferably, the metal used in the formation of the cathode electrode is an alloy containing at least one of aluminum, zirconium, titanium, yttrium, scandium and silicon.

The above-described cathode metals and metal alloys have a high melting point, and under a vacuum, can reduce a metal ion in the organic metal complex compound to the corresponding metal.

Generally, some alkali metals, alkali earth metals and rare earth metals can exhibit a higher saturated vapor pressure than that of high-melting-point metals such as aluminum, and therefore any compound containing such alkali metals, or the like, can be reduced with the high-melting-point metals such as aluminum, silicon, zirconium and the like. For example, it is well known that calcium oxide can be reduced with aluminum to form a liberated metal calcium (cf. Chemical Handbook, "Applied Chemistry Section I", edited by the Chemical Society of Japan, Maruzen Co., p.369), and rubidium oxide and strontium oxide (cf. Metal Handbook, edited by the Japan Institute of Metals, Maruzen Co., pp.88–89) can be also reduced with aluminum to form a liberated metal rubidium and strontium, respectively.

The production of metal electrodes in the organic EL devices is carried out in a vacuum of not more than $10^{-5}$Torr to deposit an atomic metal on a substrate upon melting and volatilization of the metal. Therefore, when a thermally reducible metal such as aluminum, silicon, zirconium, and the like, in an atomic state is applied onto the alkali metal compound, alkali earth metal compound or rare earth metal compound, the above-described reduction reaction in vacuum results so as to produce a reduced and liberated metal from the corresponding metal compound. In this reduction process, if the electron injection layer is constituted from a mixed layer including the organic metal complex compound and the electron transporting organic compound; the alkali metal, alkali earth metal or rare earth metal produced upon reduction and liberation of the organic metal complex compound can effectively reduce the adjacent electron transporting organic compound, thereby forming a metal doping layer.

If the alkali metal, alkali earth metal or rare earth metal compound to be reduced is an inorganic compound such as an oxide, a fluoride, and the like, it is sometimes difficult to make co-deposition of such metals with the electron transporting organic compound to form an organic layer, because the inorganic compound has a high evaporation temperature due to good stability thereof. Furthermore, due to high electrical insulation property of the inorganic compound, the remaining molecules of the inorganic compound which are unreduced may increase the driving voltage of the EL device.

In the present invention, an alkali metal, alkali earth metal or rare earth metal compound was used as the organic metal complex compound, in place of the inorganic compound thereof. The organic metal complex compound and the electron transporting organic compound were co-deposited and mixed to form a mixed layer. The produced mixed layer was further coated with a cathode electrode made of a specific electrode material which contains a metal capable of reducing, in a vacuum, the metal ion(s) contained in the organic metal complex compound. Thus, based on the high reducing power of the cathode metal in a vacuum, a metal could be reduced and liberated from the organic metal complex compound in the mixed layer and then the adjacent electron transporting organic compound could be reduced with the liberated metal. The inventors of the present invention have thus succeeded to diminish an electron injection barrier, thereby reducing a driving voltage of the device.

In practice, the organic metal complex compound used in the formation of the electron injection layer is not restricted to a specific compound. However, the following is preferably used as a metal ion thereof: at least one metal ion of the alkali metal ions, alkali earth metal ions and rare earth metal ions. As the ligand compound for the metal complex compound, although they are not restricted to the below-described, quinolinol, benzoquinolinol, acrydinol, phenanethridinol, hydroxyphenyloxazole, hydroxyphenyl thiazole, hydroxydiaryloxadiazole, hydroxydiarylthiadiazole, hydroxyphenylpyridine, hydroxyphenylbenzoimidazole, hydroxybenzotriazole, hydroxyfurborane, bipyridyl, phenanethroline, phthalocyanine, porphyrin, cyclopentadiene, β-diketones, azomethines and derivatives thereof, are preferably used.

The present disclosure relates to subject matter contained in Japanese Patent Application No.10-357899 (filed on Dec. 16, 1998) which is expressly incorporated herein by reference in its entirety.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Figure 1:
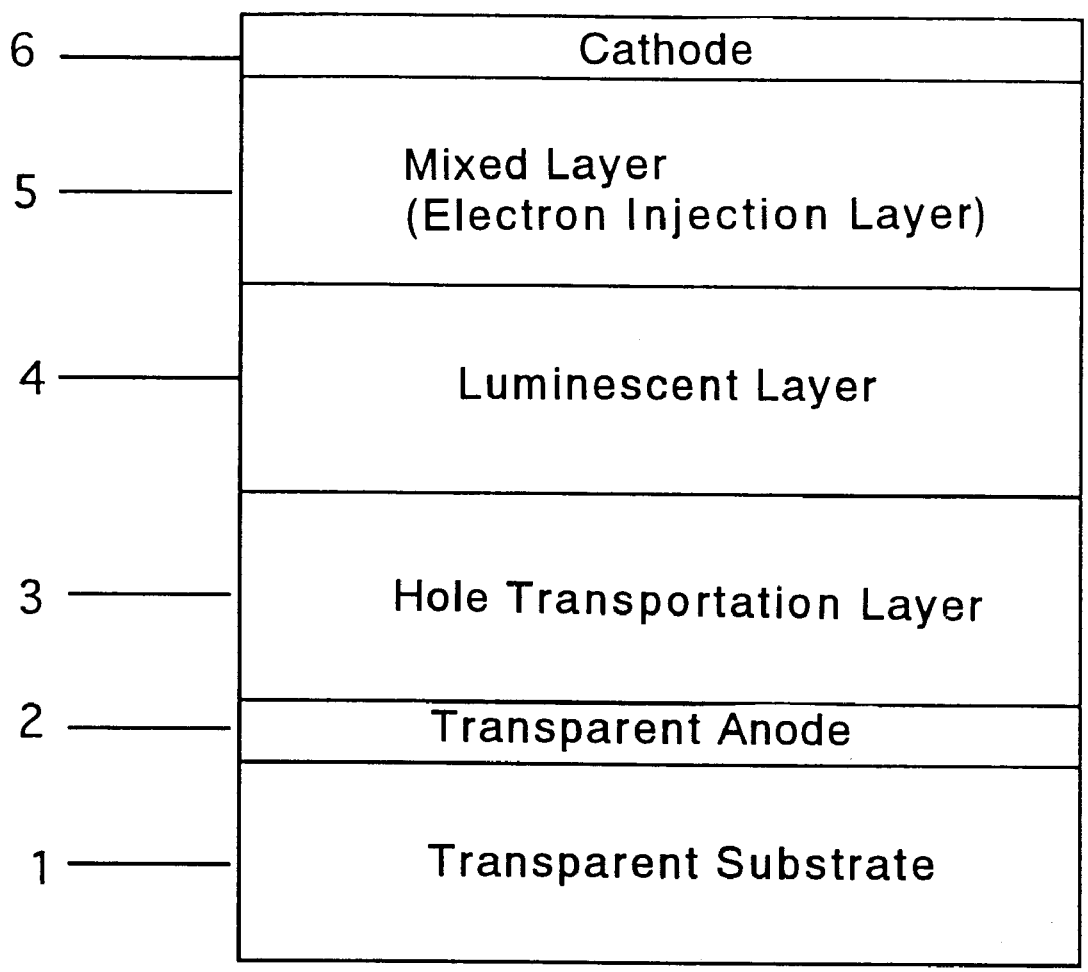
FIG. 1 is a cross-sectional view illustrating a lamination structure of the organic EL device according to a preferred embodiment of the present invention.

FIG. 1 is a simplified cross-sectional view illustrating the organic EL device according to one preferred embodiment of the present invention. A glass substrate (transparent substrate) 1 includes, laminated in the following order on a surface thereof: a transparent electrode 2 constituting an anode electrode, a hole transportation layer 3 having hole-transporting properties, a luminescent layer 4, an electron injection layer (also referred to as "a mixed layer" or "an organic layer") 5 and a cathode electrode (back electrode) 6. Among above-described device components (layers), the glass substrate (transparent substrate) 1, the transparent electrode 2, the hole transportation layer 3, and the luminescent layer 4 can be components known in the art. However, the electron injection layer (mixed layer) 5 and the cathode electrode 6 each has specific features suggested by the present invention.

In addition to the illustrated lamination structure of the EL device, the organic EL device of the present invention can include other lamination structures such as: an anode, a luminescent layer, an electron injection layer (mixed layer), and a cathode; an anode, a hole transportation layer, a luminescent layer, an electron injection layer (mixed layer), and a cathode; an anode, a hole transportation layer, a luminescent layer, an electron transportation layer, an electron injection layer (mixed layer) and a cathode; an anode, a hole injection layer, a hole transportation layer, a luminescent layer, an electron injection layer (mixed layer), and a cathode; an anode, a hole injection layer, a hole transportation layer, a luminescent layer, an electron transportation layer, an electron injection layer (mixed layer), and a cathode. The organic EL device of the present invention can have any desired lamination structure, as long as a combination of the electron injection layer (mixed layer) 5 and the cathode electrode 6 satisfies the above-described requirements of the present invention.

The formation of the electron injection layer (mixed layer) 5 may be carried out by using any desired methods for forming thin films including, for example, a vapor deposition method or a sputtering method. In addition to these methods, if its layer can be formed from a coating solution, the electron injection layer 5 may be formed from the coating solution by using any desired coating methods such as a spin coating method, a dip coating method or an ink jet printing method.

Furthermore, the formation of the cathode electrode 6 can be carried out by using the vapor deposition method and the sputtering method; however, any other method may be used, if desired, as long as the method is based on film formation in a vacuum.

In the production of the organic EL device, the organic compounds used as the electron-transporting organic compound in the electron injection layer (mixed layer), in the formation of the luminescent layer and the electron transportation layer are not restricted to specific compounds. However, typical examples of suitable organic compounds include polycyclic compounds such as p-terphenyl and quaterphenyl, as well as derivatives thereof; condensed polycyclic hydrocarbon compounds such as naphthalene, tetracene, pyrene, coronene, chrysene, anthracene, diphenylanthracene, naphthacene and phenanthrene, as well as derivatives thereof; condensed heterocyclic compounds such as phenanthroline, bathophenanthroline, phenanthridine, acridine, quinoline, quinoxaline, phenazine and the like as well, as derivatives thereof; and fluoreceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone and rubrene, as well as derivatives thereof.

In addition to these organic compounds, metal-chelated complex compounds described in Japanese Unexamined Patent Publication (Kokai) Nos. 63-295695, 8-22557, 8-81472, 5-9470 and 5-17764 can be appropriately used as the organic compounds. Among these metal-chelated complex compounds, metal-chelated oxanoide compounds, for example, metal complexes which contain, as a ligand thereof, at least one member selected from 8-quinolinolato such as tris(8-quinolinolato)aluminum, bis(8-quinolinolato) magnegium, bis[benzo(f)-8-quinolinolato]zinc, bis(2-methyl-8-quinolinolato)aluminum, tri(8-guinolinolato) indium, tris(5-methyl-8-quinolinolato) aluminum, 8-quinolinolatolithium, tris(5-chloro-8-quinolinolato) gallium and bis(5-chloro-8-quinolinolato) calcium, as well as derivatives thereof, can be appropriately used.

Furthermore, oxadiazoles disclosed in Japanese Patent Kokai Nos. 5-202011, 7-179394, 7-278124 and 7-228579, triazines disclosed in Japanese Patent Kokai No. 7-157473, stilbene derivatives and distyrylarylene derivatives disclosed in Japanese Patent Kokai No. 6-203963, styryl derivatives disclosed in Japanese Patent Kokai Nos. 6-132080 and 6-88072, and diolefin derivatives disclosed in Japanese Patent Kokai Nos.6-100857 and 6-207170 are preferably used in the formation of the luminescent layer and the electron transportation layer.

Furthermore, a fluorescent whitening agent such as benzoxazoles, benzothiazoles and benzoimidazoles can be used as the organic compounds, and includes, for example, those described in Japanese Patent Kokai No. 59-194393. Typical examples of the fluorescent whitening agent include the fluorescent whitening agents classified under the group of benzoxazoles such as 2,5-bis(5,7-di-t-pentyl-2-benzoxazolyl)-1,3,4-thiadiazole, 4,4'-bis(5,7-t-pentyl-2-benzoxazolyl)stilbene, 4,4'-bis[5,7-di(2-methyl-2-butyl)-2-benzoxazolyl]stilbene, 2,5-bis(5,7-di-t-pentyl-2-benzoxazolyl)thiophene, 2,5-bis[5-($\alpha$, $\alpha$-dimethylbenzyl)-2-benzoxazolyl]thiophene, 2,5-bis[5,7-di(2-methyl-2-butyl)-2-benzoxazolyl]-3,4-diphenylthiophene, 2,5-bis(5-methyl-2-benzoxazolyl)thiophene, 4,4'-bis(2-benzoxazolyl) biphenyl, 5-methyl-2-{2-[4-(5-methyl-2-benzoxazolyl) phenyl]vinyl} benzoxazole and 2-[2-(4-chlorophenyl)vinyl] naphtho(1,2-d)oxazole; under the group of benzothiazoles such as 2,2'-(p-phenylenedipynylene)-bisbenzothiazole; and under the group of benzoimidazoles such as 2-{2-[4-(2-benzoimidazolyl)phenyl]vinyl} benzoimidazole and 2-[2-(4-carboxyphenyl)vinyl]benzoimidazole.

As the distyrylbenzene compound, the compounds disclosed in European Patent No. 373,582 can be used, for example. Typical examples of the distyrylbenzene compound include 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene and 1,4-bis(2-methylstyryl)-2-ethylbenzene.

Furthermore, distyrylpyrazine derivatives disclosed in Japanese Patent Kokai No. 2-252793 may also be used in the formation of the luminescent layer and the electron transportation layer. Typical examples of the distyrylpyrazine derivatives include 2,5-bis(4-methylstyryl) pyrazine, 2,5-bis (4-ethylstyryl)pyrazine, 2,5-bis[2-(1-naphthyl)vinyl] pyrazine, 2,5-bis(4-methoxystyryl)pyrazine, 2,5-bis[2-(4-biphenyl)vinyl]pyrazine and 2,5-bis[2-(1-pyrenyl)vinyl] pyrazine.

In addition, dimethylidine derivatives disclosed in European Patent No. 388,768 and Japanese Patent Kokai No. 3-231970 can also be used as the material of the luminescent layer and the electron transportation layer. Typical examples of the dimethylidine derivatives include 1,4-phenylenedimethylidine, 4,4'-phenylenedimethylidine, 2,5-xylylenedimethylidine, 2,6-naphthylenedimethylidine, 1,4-biphenylenedimethylidine, 1,4-p-terephenylenedimethylidine, 9, 10-anthracenediyldimethylidine, 4,4'-(2,2-di-t-butylphenyl vinyl)biphenyl and 4,4'-(2,2-diphenylvinyl)biphenyl, as well as derivatives thereof; silanamine derivatives disclosed in Japanese Patent Kokai Nos. 6-49079 and 6-293778; polyfunctional styryl compounds disclosed in Japanese Patent Kokai Nos. 6-279322 and 6-279323; oxadiazole derivatives disclosed in Japanese Patent Kokai Nos. 6-107648 and 6-92947; anthracene compounds disclosed in Japanese Patent Kokai No. 6-206865; oxynate derivatives disclosed in Japanese Patent Kokai No. 6-145146; tetraphenylbutadiene compounds disclosed in Japanese Patent Kokai No. 4-96990; and organic trifunctional compounds disclosed in Japanese Patent Kokai No. 3-296595; as well as coumarin derivatives disclosed in Japanese Patent Kokai No. 2-191694; perylene derivatives disclosed in Japanese Patent Kokai No. 2-196885; naphthalene derivatives disclosed in Japanese Patent Kokai No. 2-255789; phthaloperynone derivatives disclosed in Japanese Patent Kokai Nos. 2-289676 and 2-88689; and styrylamine derivatives disclosed in Japanese Patent Kokai No. 2-250292.

Moreover, any well-known compounds which are conventional in the production of the prior art organic EL devices can be appropriately used as the organic compound in the production of the organic EL device of the present invention.

The arylamine compounds used in the formation of the hole injection layer, the hole transportation layer and the hole-transporting luminescent layer, although they are not restricted thereto, preferably include those disclosed in Japanese Patent Kokai Nos. 6-25659, 6-203963, 6-215874, 7-145116, 7-224012, 7-157473, 8-48656, 7-126226, 7-188130, 8-40995, 8-40996, 8-40997, 7-126225, 7-101911 and 7-97355. Typical examples of suitable arylamine compounds include, for example, N,N,N',N'-tetraphenyl-4,4'-diaminophenyl, N,N'-diphenyl-N,N'-di(3-methylphenyl)-4, 4'-diaminobiphenyl, 2,2-bis(4-di-p-tolylaminophenyl) propane, N,N,N', N'-tetra-p-tolyl-4,4'-diaminobiphenyl, bis (4-di-p-tolylaminophenyl) phenylmethane, N,N'-diphenyl-N,N'-di(4-methoxyphenyl)-4,4'-diaminobiphenyl, N,N,N', N'-tetraphenyl-4,4'-diaminodiphenylether, 4,4'-bis (diphenylamino)quadriphenyl, 4-N,N-diphenylamino-(2-diphenylvinyl)benzene, 3-methoxy-4-N,N-diphenylaminostilbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri (p-tolyl)amine, 4-(di-p-tolylamino)-4'-[4-(di-p-tolylamino) styryl]stilbene, N, N,N',N'-tetraphenyl-4,4'-diaminobiphenyl N-phenylcarbazole, 4,4'-bis[N-(1-naphthyl)-N-phenylamino]biphenyl, 4,4"-bis[N-(1-naphthyl)-N-phenylamino] p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4'-bis [N-(1-anthryl)-N-phenylamino] p-terphenyl, 4,4'-bis [N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino ]biphenyl, 2,6-bis(di-p-tolylamino)naphthalene, 2,6-bis[di-(1-naphthyl)amino] naphthalene, 2,6-bis[N-(1-naphthyl)-N-(2-naphthyl)amino] naphthalene, 4,4"-bis[N,N-di( 2-naphthyl)amino]terphenyl, 4,4'-bis {N-phenyl-N-[4-(1-naphthyl)phenyl]amino} biphenyl, 4,4'-bis[N-phenyl-N-(2-yrenyl)amino]biphenyl, 2,6-bis[N,N-di(2-naphthyl) amino]fluorene, 4,4'''-bis(N,N-di-p-tolylamino)terphenyl and bis(N-1-naphthyl)(N-2-naphthyl)amine. Also, any well-known arylamine compounds which are conventional in the production of organic EL devices in the prior art can be suitably used, if desired.

Furthermore, in the formation of the hole injection layer, the hole transportation layer and the hole-transporting luminescent layer, a dispersion of the above-described organic compounds in a polymer or a polymerized product of such organic compounds can be used as the layer-forming material. Also, so-called "π-conjugated polymers" such as polyparaphenylene vinylene and derivatives thereof, hole-transporting non-conjugated polymers, typically poly(N-vinylcarbazole), and σ-conjugated polymers of polysilanes can be used as the layer-forming material.

The material of the hole injection layer to be deposited over the ITO (indium-tin oxide) electrode (anode electrode) is not restricted to a specific material; however, metal phthalocyanines such as copper phthalocyanine as well as non-metal phthalocyanines, carbon films and electrically conductive polymers such as polyanilines can be preferably used in the formation of the hole injection layer. Alternatively, the hole injection layer may be formed by reacting the above-described arylamine compounds with a Lewis acid as an oxidizing agent to generate radical cations therein.

As is appreciated from the above detailed description and the appended examples, according to the present invention, since an organic layer (electron injection layer) disposed adjacent to the cathode electrode is constituted as a mixed layer from an organic metal complex compound containing at least one of the alkali metal ions, alkali earth metal ions and rare earth metal ions with an electron-transporting organic compound; and furthermore, the cathode electrode is constituted from a metal capable of reducing, in a vacuum, the metal ion(s) in the metal complex compound constituting the organic layer; it becomes possible in the production of the organic EL devices to utilize, as a cathode material therefor, low cost and stable metals which are conventionally utilized as a wiring material in EL devices, and other similar devices, of the prior art.

In addition to these distinctive advantages, it becomes possible to produce the EL devices having a diminished electron injection barrier, being capable of operating at a reduced driving voltage with a high efficiency and high luminance. Accordingly, the EL devices of the present invention can exhibit a high utility in the practical use thereof, and ensures their effective utilization as display devices, and light sources etc.

EXAMPLES

The present invention will be further described with reference to the following examples, however, it should be noted that the present invention is not restricted by these examples.

In the following examples, vapor deposition of the organic compound and the metal was carried out by using the vapor deposition apparatus "VPC-400" commercially available from Shinkuu Kikou Co. The thickness of the deposited layers was determined by using the profilometer "DekTak3ST" commercially available from Sloan Co. Furthermore, the characteristics of the organic EL device were determined by using the source meter "2400" commercially available from Keithley & Co. and the luminance meter "BM-8" commercially available from Topcon Co. A DC-voltage was stepwise applied at an increasing rate of one volt per 2 seconds to the EL device having an ITO anode and an aluminum (Al) cathode, and the luminance and the electric current were determined after one second had passed from the completion of each increase of the voltage. The EL spectrum was determined by using the optical multichannel analyzer "PMA-10", commercially available from Hamamatsu Photonics Co., driven at a constant electric current.

Example 1

The organic EL device having the lamination structure illustrated in FIG. 1 was produced according to the present invention.

A glass substrate 1 was coated with an ITO (indium-tin oxide) layer having a sheet resistance of 25 Ω/□, commercially available as a sputtering deposition product from Sanyo Shinku Co., to form a transparent anode electrode 2. Alpha (α)-NPD having a hole transporting property, represented by the following formula (I), was deposited onto the ITO-coated glass substrate 1 under the vacuum vapor deposition conditions of $10^{-6}$ Torr and 2 Å/sec to form a hole transportation layer 3 having a thickness of 500 Å.

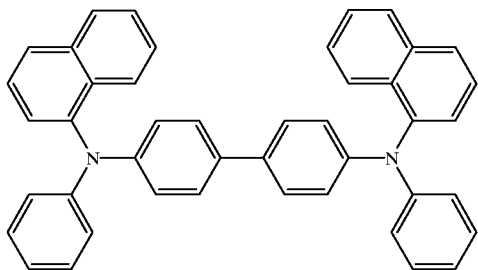

(I)

Thereafter, an aluminum complex of tris(8-quinolinolato) (hereinafter, referred to as "Alq") capable of exhibiting a green luminescence, represented by the following formula (II), was deposited onto the hole transportation layer 3 under the same vacuum vapor deposition conditions as in the above-described deposition of the hole transportation layer 3 to form a luminescent layer 4 having a thickness of 650 Å.

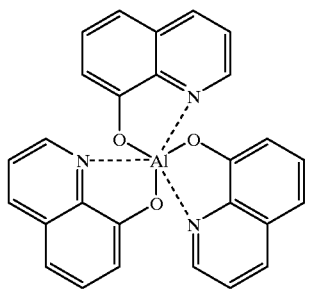

(II)

After the formation of the luminescent layer 4, to form an electro injection layer 5 in the form of a mixed layer, a lithium complex of mono(8-quinolinolato) (referred to as "Liq", as an organic metal complex compound) represented by the following formula (III) and Alq (as an electron-transporting organic compound) in a molar ratio of 1:1 (Liq:Alq) were co-deposited under the pressure of $10^{-6}$ Torr onto the luminescent layer 4. The electron injection layer 5 having a thickness of 50 Å was thus obtained.

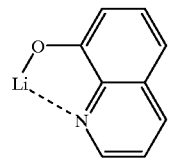

(III)

Finally, aluminum (Al) was deposited at the deposition speed of 10 Å/sec onto the electron injection layer (mixed layer) 5 to form a cathode electrode 6 having a thickness of 1,000 Å. The organic EL device having a square luminescent area of 0.5cm (length) by 0.5cm (width) was thus obtained.

Figure 2:
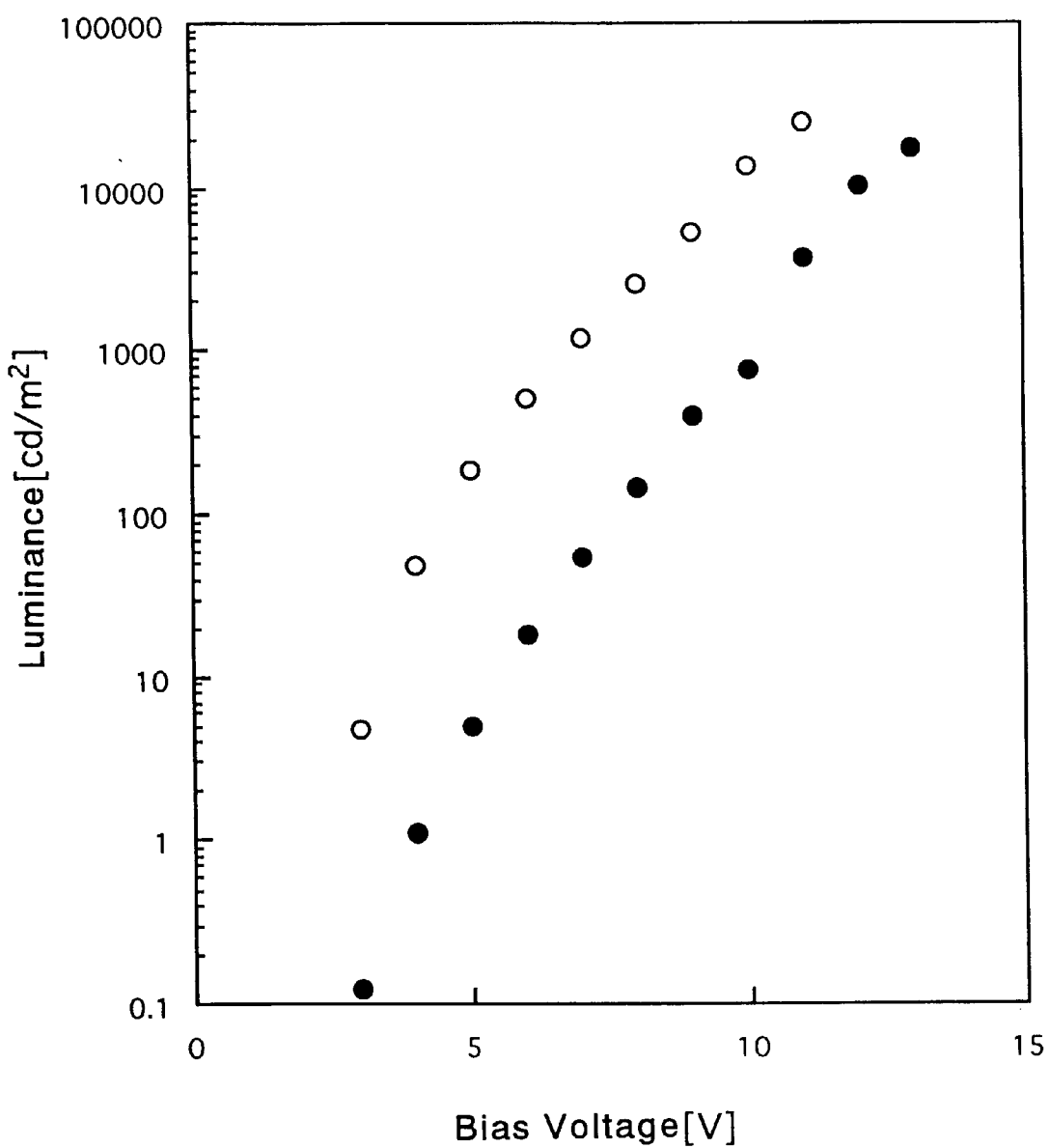
FIG. 2 is a graph showing the relationship between the bias voltage and the luminance for the organic EL device of Example 1 and the organic EL device of Comparative Example 1, of the present invention.

In the produced organic EL device, a DC voltage was applied to between the transparent anode electrode (ITO) 2 and the cathode electrode (Al) 6, and the luminance of the green luminescence from the luminescent layer (Alq) 4 was determined to obtain the results plotted with white dots in FIG. 2. It can be appreciated from FIG. 2 showing the relationship between the bias voltage and the luminance of the EL device that a high luminance of at most 27,500 cd/m$^2$ could be obtained at the applied bias voltage of 11 volts, and a luminance of 1,000 cd/m$^2$ could be obtained at the applied bias voltage of 6.5 volts.

Comparative Example 1

The procedure of Example 1 was repeated to produce an organic EL device with the proviso that, for the purpose of comparison, an electron injection layer 5 was formed from only the organic metal complex compound (Liq) of the above formula (III). That is, α-NPD was first deposited onto the ITO-coated glass substrate to form a hole transportation layer having a thickness of 500 Å, and then Alq was deposited under the same vacuum deposition conditions as in the deposition of the hole transportation layer to form a luminescent layer having a thickness of 700 Å. Furthermore, an electron injection layer having a thickness of 5 Å was deposited from Liq under the deposition speed of 1 Å/sec. Thereafter, aluminum (Al) was deposited at a thickness of 1,000 Å over the electron injection layer (Liq) to form a cathode electrode. The organic EL device was thus obtained.

In the produced organic EL device, the luminance of the green luminescence from the luminescent layer was determined as in Example 1 to obtain the results plotted with black dots in FIG. 2. It can be appreciated from FIG. 2 that only a luminance of at most 21,000 cd/M$^2$ was obtained at the increased applied bias voltage of 13 volts, and the applied bias voltage of 9.5 volts was required to obtain a luminance of 1,000 cd/m$^2$.

Hence, the results of FIG. 2 indicate that the presence of a mixed layer such as the electron injection layer 5 used in Example 1 is effective to reduce the driving voltage of the EL devices.

Example 2

The procedure of Example 1 was repeated to produce an organic EL device with the proviso that in this example, α-NPD was first deposited onto the ITO-coated glass substrate 1 to form a hole transportation layer 3 having a thickness of 500 Å, followed by vacuum deposition of Alq to form a luminescent layer 4 having a thickness of 400 Å. Thereafter, the organic metal complex compound (Liq) and the electron-transporting organic compound (Alq) in a molar ratio of 1:1 (Liq:Alq) were co-deposited to form an electron injection layer (mixed layer) 5 having a thickness of 300 Å. After the formation of the electron injection layer 5, aluminum (Al) was deposited at a thickness of 1,000 Å over the electron injection layer 5 to form a cathode electrode 6.

Figure 3:
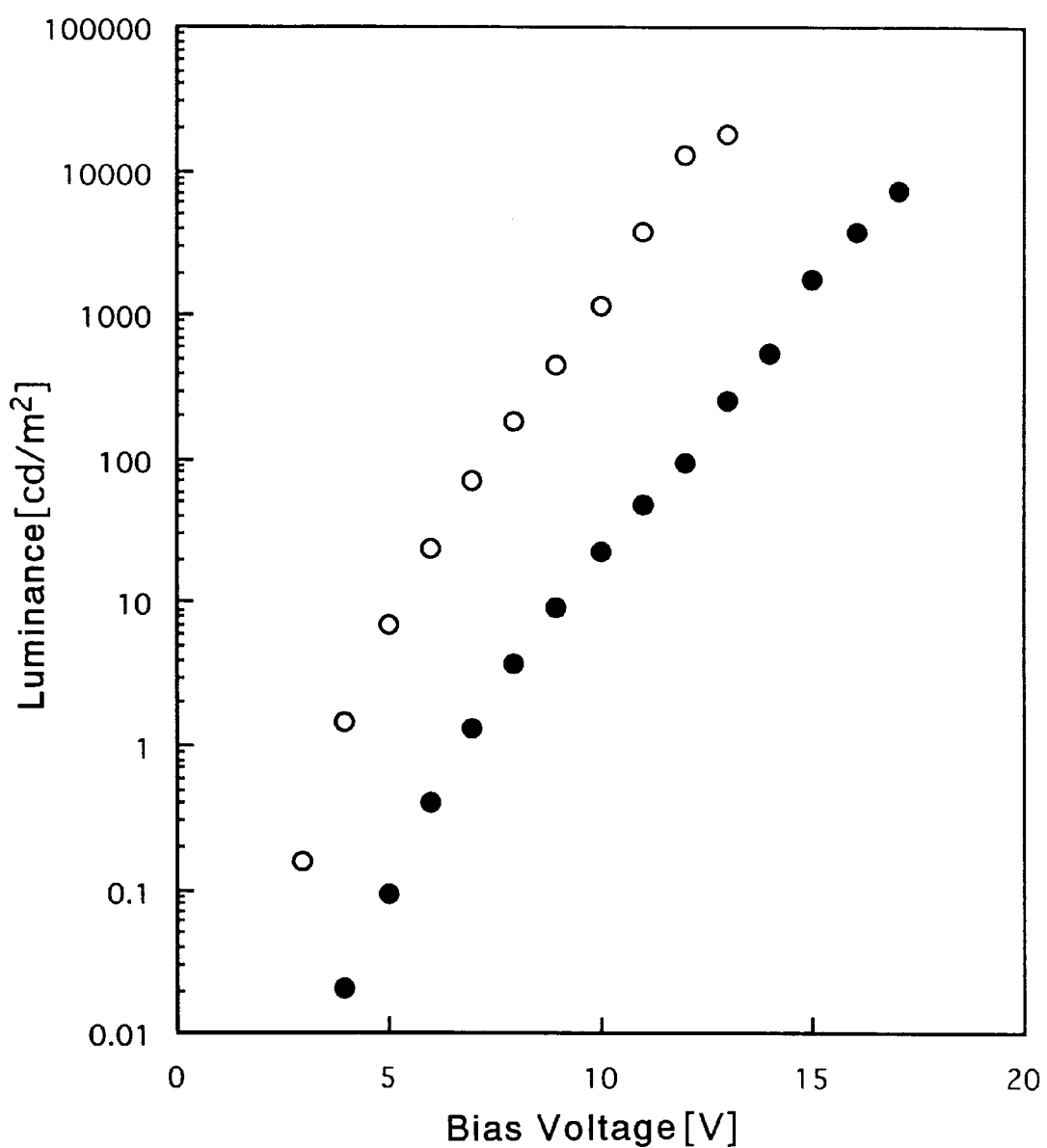
FIG. 3 is a graph showing the relationship between the current density and the luminance for the organic EL device of Example 2 and the organic EL device of Comparative Example 2, of the present invention.

In the produced organic EL device, as is plotted with white dots in FIG. 3, maximum luminance of 19,000 cd/M$^2$ could be obtained at the applied bias voltage of 14 volts, and the applied bias voltage of 10 volts was required to obtain a luminance of 1,000 cd/M$^2$.

It can be appreciated from the comparison of the above results with those of Example 1 that the luminance property of the EL device of Example 2 is slightly poorer than that of Example 1. However, although the thickness of the electron injection layer 5 was increased in this example, such an increase of thickness did not adversely affect the luminance property of the device. Note that the luminance comparable to that of the Comparative Example 1 could be obtained in Example 2.

Comparative Example 2

The procedure of Example 2 was repeated to produce an organic EL device with the proviso that, for the purpose of comparison, an electron injection layer was formed from the inorganic compound, lithium fluoride (LiF) and the electron-transporting organic compound (Alq). That is, α-NPD was first deposited onto the ITO-coated glass substrate to form a hole transportation layer having a thickness of 500 Å, followed by vacuum deposition of Alq to form a luminescent layer having a thickness of 400 Å. Thereafter, lithium fluoride (LiF) and the electron-transporting organic compound (Alq) in a molar ratio of 1:1 (LiF: Alq) were co-deposited to form an electron injection layer (mixed layer) having a thickness of 300 Å. After the formation of the electron injection layer, aluminum (Al) was deposited at a thickness of 1,000 Å over the electron injection layer to form a cathode electrode.

In the produced organic EL device, as is plotted with black dots in FIG. 3, only maximum luminance of 7,300 cd/m$^2$ was obtained at the applied bias voltage of 17 volts, and the applied bias voltage of 15.5 volts was required to obtain a luminance of 1,000 cd/m$^2$.

The comparison of the above results with those of Example 2 indicates that an electrically insulating inorganic compound such as LiF can remarkably deteriorate the luminance property of the EL device, in contrast to the organic metal complex compound, due to the unreduced LiF being retained in the electron injection layer (mixed layer).

Although the invention hag been described with reference to particular means, materials and embodiments, it is to be understood that the invention is not limited to the particulars disclosed and extends to all equivalents within the scope of the claims.

What is claimed is:

1. An organic electroluminescent device comprising at least one luminescent layer, constituted from an organic compound, between a cathode electrode and an anode electrode opposed to said cathode electrode; wherein:

said electroluminescent device further comprises an organic layer adjacent to said cathode electrode, said organic layer being a mixed layer of an electron-transporting organic compound and an organic metal complex compound containing at least one member selected from the group comprising an alkali metal ion, an alkali earth metal ion and a rare earth metal ion; and said cathode electrode comprising a metal capable of reducing the metal ion(s) in said organic metal complex compound of said mixed layer, in a vacuum, to the corresponding metal.

2. The organic electroluminescent device according to claim 1, in which said mixed layer is a layer formed upon co-deposition of said organic metal complex compound and said electron-transporting organic compound.

3. The organic electroluminescent device according to claim 1, in which the metal used in the formation of said cathode electrode is any one of aluminum, zirconium, titanium, yttrium, scandium and silicon.

4. The organic electroluminescent device according to claim 1, in which the metal used in the formation of said cathode electrode is an alloy containing at least one of aluminum, zirconium, titanium, yttrium, scandium and silicon.

5. The organic electroluminescent device according to claim 4, in which a work function of said alloy is greater than 4.0 eV.

* * * * *

UNITED STATES PATENT AND TRADEMARK OFFICE
Certificate

Patent No. 6,396,209 B1                                                                   Patented: May 28, 2002

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Junji Kido, Yamagata-ken, (JP); Tokio Mizukami, Kanagawa-ken, (JP); Jun Endoh, Kanagawa-ken, (JP); Kohichi Mori, Kanagawa-ken, (JP); Toshio Matsumoto, Kanagawa-ken, (JP).

Signed and Sealed this Fourth Day of March 2008.

NIMESHKUMAR D. PATEL
*Supervisory Patent Examiner*
Art Unit 2879